United States Patent [19]
Vu et al.

[11] Patent Number: 6,027,958
[45] Date of Patent: Feb. 22, 2000

[54] TRANSFERRED FLEXIBLE INTEGRATED CIRCUIT

[75] Inventors: Duy-Phach Vu, Taunton; Brenda Dingle, Mansfield; Ngwe K. Cheong, Quincy, all of Mass.

[73] Assignee: Kopin Corporation, Taunton, Mass.

[21] Appl. No.: 08/680,210

[22] Filed: Jul. 11, 1996

[51] Int. Cl.[7] .................................................. H01L 21/44
[52] U.S. Cl. ......................... 438/110; 438/457; 257/679
[58] Field of Search ................................. 438/110, 113, 438/455, 457, 459, 577; 257/679

[56] References Cited

U.S. PATENT DOCUMENTS

| | | | |
|---|---|---|---|
| 3,616,345 | 10/1971 | Emmasingel | 204/143 |
| 4,219,596 | 8/1980 | Takemoto et al. | 428/41 |
| 4,313,995 | 2/1982 | Delgadillo | 428/201 |
| 4,329,779 | 5/1982 | England | 29/840 |
| 4,393,576 | 7/1983 | Dahlberg | 29/572 |
| 4,714,980 | 12/1987 | Hara | 361/395 |
| 4,790,902 | 12/1988 | Wada et al. | 156/630 |
| 4,839,232 | 6/1989 | Morita et al. | 428/473.5 |
| 4,847,146 | 7/1989 | Yeh et al. | 428/332 |
| 4,918,811 | 4/1990 | Eichelberger et al. | 438/107 |
| 4,924,589 | 5/1990 | Leedy | 29/832 |
| 4,980,016 | 12/1990 | Tada et al. | 156/629 |
| 4,980,034 | 12/1990 | Volfson et al. | 204/38.4 |
| 5,013,397 | 5/1991 | Tsukakoshi | 156/631 |
| 5,095,401 | 3/1992 | Zavracky et al. | 361/283 |
| 5,103,557 | 4/1992 | Leedy | 29/832 |
| 5,155,068 | 10/1992 | Tada | 437/211 |
| 5,256,562 | 10/1993 | Vu et al. | 437/86 |
| 5,258,325 | 11/1993 | Spitzer et al. | 438/107 |
| 5,276,590 | 1/1994 | Budman et al. | 361/796 |
| 5,300,788 | 4/1994 | Fan et al. | 257/13 |
| 5,310,451 | 5/1994 | Tejwani et al. | 156/630 |
| 5,328,534 | 7/1994 | Calhoun et al. | 156/150 |
| 5,354,695 | 10/1994 | Leedy | 437/7 |
| 5,362,656 | 11/1994 | McMahon | 437/21 |
| 5,373,627 | 12/1994 | Grebe | 29/841 |

(List continued on next page.)

FOREIGN PATENT DOCUMENTS

| | | |
|---|---|---|
| 0 474 474 A3 | 3/1992 | European Pat. Off. . |
| 0 486 318 A1 | 5/1992 | European Pat. Off. . |
| 0 637 841 A2 | 2/1995 | European Pat. Off. . |
| 0 703 619 A1 | 2/1996 | European Pat. Off. . |
| 2 599 893 A1 | 12/1987 | France . |
| 4240762 | 8/1992 | Japan . |
| 07202147 | 8/1995 | Japan . |
| 08111360 | 4/1996 | Japan . |
| WO93/18428 | 9/1993 | WIPO . |
| WO94/10600 | 5/1994 | WIPO . |
| WO 96/39712 | 12/1996 | WIPO . |

OTHER PUBLICATIONS

Judy, J., et al, "Magnetic Microactuation of Polysilicon Flexure Structures", Journal of Microelectromechanical Systems, vol. 4, No. 4, Dec. 1995.

Yang, W., "Trends in Electronic Image Sensing and Processing", Seminar Handout at The Lasers and Electro Optics meeting by (MIT Lincoln Laboratory), (Apr. 18, 1996) (1 pg.).

Proceedings First International Conference on Flex Circuits, Oct. 12–14, 1994, "Flex Circuit Solutions for Advanced "MR" Head Disk Drives", Semiconductor Technology Center, Inc., pp. 1–185.

Petersen, K. E., "Silicon as a Mechanical Material", *Proceedings of the IEEE*, 70(5): 420–457 (May 1982).

Fossum, E. R., "CMOS Image Sensors: Electronic Camera On a Chip", *IEDM*, pp. 17–25 (1995).

*Primary Examiner*—Kevin M. Picardat
*Attorney, Agent, or Firm*—Hamilton, Brook, Smith & Reynolds, P.c.

[57] ABSTRACT

Integrated circuits for use in electronic devices requiring high density packaging are fabricated to provide highly flexible and ultra-thin devices having a variety of applications. The flexible circuits have dimensions up to several centimeters in surface area and thicknesses of a few microns. These circuits are fabricated using transfer techniques which include the removal of VLSI circuits from silicon wafers and mounting of the circuits on application specific substrates.

40 Claims, 8 Drawing Sheets

U.S. PATENT DOCUMENTS

| | | | |
|---|---|---|---|
| 5,376,561 | 12/1994 | Vu et al. | 437/31 |
| 5,377,031 | 12/1994 | Vu et al. | 359/59 |
| 5,391,257 | 2/1995 | Sullivan et al. | 438/977 |
| 5,395,481 | 3/1995 | McCarthy | 156/630 |
| 5,399,231 | 3/1995 | McCarthy | 156/630 |
| 5,407,511 | 4/1995 | Nakatani et al. | 156/230 |
| 5,414,276 | 5/1995 | McCarthy | 257/57 |
| 5,420,055 | 5/1995 | Vu et al. | 437/40 |
| 5,426,526 | 6/1995 | Yamamoto et al. | 359/82 |
| 5,488,012 | 1/1996 | McCarthy | 437/62 |
| 5,527,741 | 6/1996 | Cole et al. | 438/107 |
| 5,572,045 | 11/1996 | Takahasi et al. | 257/59 |
| 5,593,917 | 1/1997 | Nuyen | 438/107 |
| 5,646,432 | 7/1997 | Iwaki et al. | 257/347 |
| 5,656,552 | 8/1997 | Hudak et al. | 438/977 |
| 5,663,075 | 9/1997 | Robinson | 438/977 |
| 5,663,078 | 9/1997 | McCarthy | 438/157 |
| 5,674,758 | 10/1997 | McCarthy | 437/21 |
| 5,770,487 | 6/1998 | Maas et al. | 438/459 |

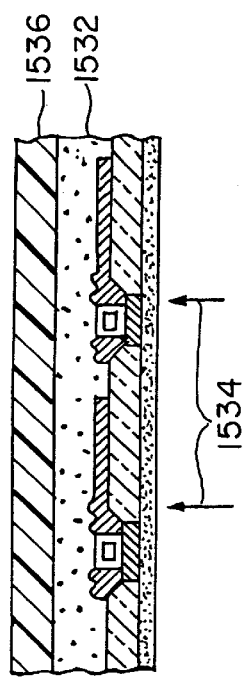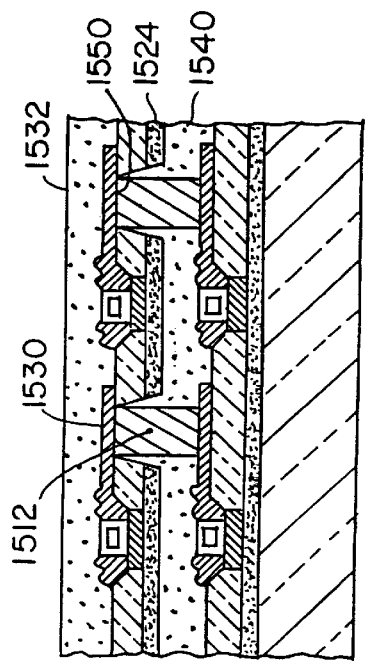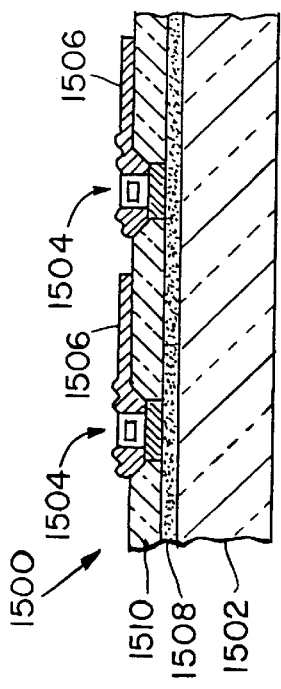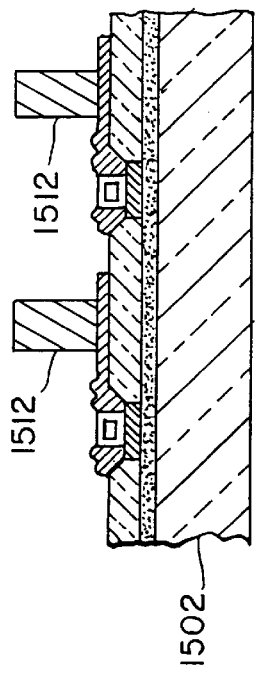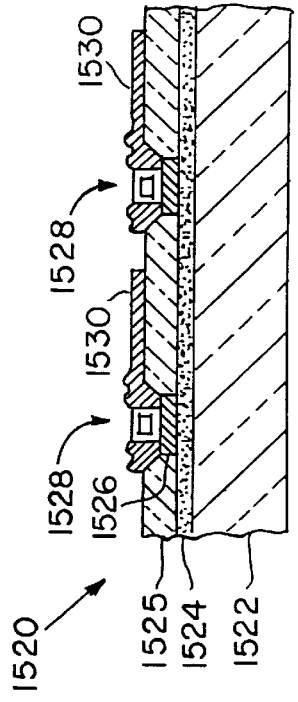

TRANSFERRED FLEXIBLE INTEGRATED CIRCUIT

BACKGROUND OF THE INVENTION

Integrated circuit technology now requires, more than ever, high density packaging in a flexible form to accommodate portability. Spatial and weight constraints associated with consumer electronics, such as notebook computers, pagers and cellular phones, require fewer interconnections between devices in exchange for greater integration.

Most integrated circuits are formed on semiconductor wafers and mounted using chip carriers or packages onto printed circuit boards. Another area of interest has been on techniques to improve device density by forming what are commonly known as multi-chip modules (MCMs). In a multi-chip module, one high density device makes connection to another upon a common substrate.

A further area of interest has been on techniques to lay passive components as well as, integrated circuits on flexible material resulting in so called "flexible circuits". Also, the combined technique of fabricating MCMs placed on flexible material has been the subject of research activity. These devices to date, however, merely include discrete non-flexible circuits on a flexible support material or simply wires on or within a flexible material referred to generally as "flex cable". Circuit elements that can undergo flexible movement have been limited to metal interconnect devices.

Presently, there is a continuing need to improve the fabrication process for circuits to accommodate more complex electronic systems which require active circuit elements in a significantly reduced size.

SUMMARY OF THE INVENTION

The present invention relates to methods of fabricating highly flexible integrated circuits by way of thin film circuit transfer technology. In particular, the present methods yield thin-film integrated circuit devices having dimensions in the micron or submicron range which are transferred onto a flexible support material. The ultra-thin circuits fabricated in accordance with the methods of the present invention can tolerate bending movements and the tensile and compressive stresses resulting from such movements while maintaining circuit integrity. This process provides for the fabrication of complex conformal active integrated circuit components having many device applications including displays, detectors, interconnects, multichip modules, communications, PCMCIA cards, and smart card devices, and can include processors and memory devices.

Integrated circuits are traditionally fabricated using semiconductor materials such as single crystal silicon and various III–V materials such as gallium arsenide. Single crystal silicon is a hard, brittle material however, and the integrated circuit chips fabricated using this material are mounted on chip carriers and circuit boards having a high rigidity to prevent mechanical stresses or other forces from being exerted on each chip and thereby maximize yield and lifetime. Single crystal silicon has a tensile yield strength of $6.9 \times 10^{10}$ dyne/cm$^2$ and a Young's Modules of $1.9 \times 10^{12}$ dyne/cm$^2$. Silicon typically yields by fracturing at room temperature while metals usually yield by inelastic deformation. Thus the crystalline materials used for integrated circuits are not generally known as being well suited for flexible circuit applications.

The present invention addresses this problem by providing for the fabrication of continuous and/or spaced regions of semiconductor material that are interconnected to form a single integrated circuit on a flexible substrate. The spaced regions of semiconductor material are dimensioned and separated on a flexible substrate and are interconnected with materials such that the circuit can undergo substantial bending movements along one or more axes. The amount of the spacing between semiconductor components, the flexibility of the supporting substrate and the flexibility of the interconnecting materials between the semiconductor components determines the range of motion which the circuit can undergo without loss of circuit function. Additionally, thin films of continuous semiconductor material that are less than 100 microns thick and preferably under 10 microns thick are sufficiently flexible that circuit elements smaller than 100 microns in the plane of the circuit that are fabricated with the thin film can undergo bending motions of up to a 1 inch (2.54 cm) radius of curvature and retain circuit performance. The circuits of the present invention have a minimum radius of curvature of at least 10 inches (25.4 cm) and preferably of at least 5 inches (12.7 cm) to provide the desired flexibility for many applications.

In a preferred embodiment, a single transfer process is employed in which thin flexible integrated circuit elements are fabricated within a single crystal silicon layer formed over an insulated silicon substrate (SOI). The circuit is overlaid with an encapsulating layer before being transferred onto a second substrate such as glass. The second substrate is provided with a layer of adhesive on the contact surface and a separation layer or etch stop, such as a copper film between the substrate and adhesive layer. The integrated circuit is then transferred onto the second substrate such that the encapsulating layer bonds with the adhesive layer. The silicon substrate is then removed to expose a silicon oxide layer that can be used as an insulating layer on a silicon wafer. Portions of the silicon oxide layer are then removed to expose the contacts of the integrated circuits or to further process the integrated circuit. Similarly, the second substrate is released at the separation layer to yield a circuit structure having thickness in the range of 0.1 to 100 microns or more, depending upon the specific application. For most applications, a transferred circuit structure of less than 20 microns is preferred. For many CMOS circuit applications silicon films preferably have a thickness in the range of 0.3–1.5 microns. In the final structure, the separation layer, such as copper, can remain within the structure to provide support, electrical shielding, thermal control and/or grounding, or alternatively, can be removed. Upon removal of the second substrate the circuit is supported with the adhesive layer which bends readily. The device is then completed, sealed and any necessary external connectors or bonding pads are completed or exposed, respectively.

The adhesive can be commercially available epoxies such as Tracon or EP-112, or a thermally conductive epoxy such as EP-30AN having aluminum nitride particles suspended therein. The adhesive layers employed herein can have varying thickness up to 75 microns or more.

In another preferred embodiment, a double transfer process is employed in which the circuits are transferred to an intermediate substrate before being transferred to a third substrate. In the preferred embodiment, flexible integrated circuit devices are fabricated and then covered with an encapsulating layer. The structure containing the integrated circuits is then transferred onto a second substrate so that the encapsulating layer bonds with a layer of adhesive. A thin layer of amorphous silicon serving as a release layer and/or etch stop, or other separation layer is positioned between the second substrate and the adhesive layer. The silicon substrate is removed to expose the flat surface of a silicon dioxide layer. The second substrate provides an intermediate support prior to transferring the circuit to a releasable third substrate or a flexible application-specific substrate.

The application-specific substrate can be a highly flexible material such as a plastic or Teflon material. The final substrate is prepared to receive the circuit by providing a second layer of adhesive without a separation layer. The circuit is then transferred from the second substrate onto the final substrate such that the flat surface of the silicon dioxide layer bonds with the second adhesive layer. Optionally, the silicon dioxide layer can be further processed to fabricate and/or interconnect devices with the single crystal silicon layer before transfer to the second substrate. The resulting structure is submerged in an acidic solution, such as hydroflouric (HF) acid, to remove the second substrate such as glass. Such solution provides means for removing the glass and other substrates while rendering the final substrate and separation layers, such as Teflon, copper or amorphous silicon, intact.

Alternatively, in either single or double transfer process, the separation layer itself can have reduced adherence to the substrate which is bonded directly to the adhesive layer along an exposed peripheral region or annular ring around the separation layer. Dicing of the structure serves to release circuits which are then only loosely adhered to the substrate with the separation layer. In fact, the intrinsic stress that develops in the structure during fabrication can cause the structure to bend or delaminate after dicing and can simply be lifted from the substrate.

A copper layer can be used to provide a separation layer between one substrate and the adhesive. Preferably, the separation layer is between 100 521 and 1000 Å in thickness. The thickness of the adhesive layer is preferably less than 75 microns. The overall thickness of a single layer flexible circuit of the present invention is preferably less than 100 microns. Depending on the application, however, the overall thickness can range from 10 to 100 microns.

Another preferred embodiment can utilize the stacking of two or more layers of flexible structures. Each flexible layer can have single or double sided circuit processing and/or can be used to circuit interconnect different layers within the three dimensional circuit structure. The different circuit layers can have differing levels of rigidity such that upon final device fabrication, the resulting laminated circuit structure has a desired level of flexibility. Both single and multilayer circuit devices can be configured to have more flexibility along one axis of the device than one or more other axes of the device. This can be due to the greater flexibility of the circuit elements themselves along a particular axis, or due to the specific application which can require greater flexibility along a particular axis. The size and orientation of the spaces between semiconductive regions of the integrated circuit can be designed to accommodate the difference in flexibility requirements along different axes. These layers can be used to increase or maximize fold endurance of the circuit along one or more selected axes.

The above and other features of the invention including various novel details of construction and combinations of parts will now be more particularly described with reference to the accompanying drawings and pointed out in the claims. It will be understood that the particular embodiments of the invention described herein are shown by way of illustration only and not as a limitation of the invention. The principles and features of this invention may be employed in varied and numerous embodiments without departing from the scope of the invention.

BRIEF DESCRIPTION OF THE DRAWINGS

FIGS. 15A . 15E illustrate a process sequence for fabricating an interconnected multilayer circuit structure.

DETAILED DESCRIPTION OF THE PREFERRED EMBODIMENTS

Figure 1A:
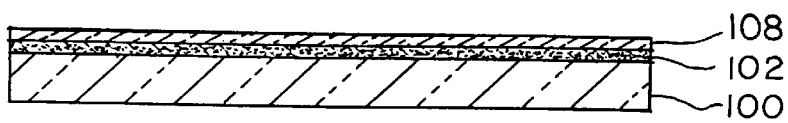
FIGS. 1A to 1D illustrate the preferred single transferred process for fabricating the flexible integrated circuit of the present invention.

A preferred method is illustrated in FIGS. 1A to 1D which include fabrication stages of a flexible circuit in accordance with the single transfer process. FIG. 1A shows a silicon-on-insulator (SOI) structure in which a thin layer of single crystal silicon 108 on a silicon dioxide layer 102 is positioned on a silicon substrate 100. In a preferred embodiment, the silicon dioxide layer has a thickness in the range of 0.05–5 microns, preferably between 0.1 and 1 microns. The advantages of an SOI material in the fabrication of high performance integrated circuits are described in U.S. Pat. Nos. 5,377,031, 5,258,325 and 5,376,561, all of which are incorporated herein by reference.

Preferably, the transfer employs an isolated silicon epitaxy wafer. This type of is prepared first by growing a thick high quality thermal oxide on a standard Czochralski wafer. A layer of high purity poly-Si is deposited on top of the oxide, followed by a deposition of an oxide capping layer. The poly-Si is then converted to a single crystal silicon using zone melt recrystallization. The result is a thin high quality Si layer residing upon an insulating $SiO_2$ layer. Other methods for fabricating SOI material can include SIMOX or bonded wafer techniques.

Figure 1B:
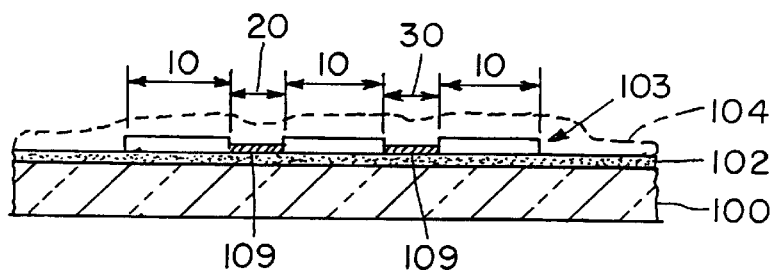

FIG. 1B illustrates the step of fabricating integrated circuit device elements 103 with the silicon layer 108 or other semiconductor material such as GaAs. These devices can include active elements, such as metaloxide-semiconductor field-effect transistors (MOSFET), CMOS circuits light-emitting diodes (LED), photovoltaic cells, other active devices, and devices made therefrom in combination with passive elements. Systems and methods for fabricating devices in GaAs particulary LEDs, can be found in U.S. Pat. No. 5,300,788 the entire contents of which is incorporated herein by reference. The device elements 103 are connected with metalized lines 109, for example, and are then protectively covered with an encapsulating layer 104. Preferably the encapsulating layer is either silicon dioxide or silicon nitride, and is in the range of 0.5–2 microns in thickness. In the preferred embodiment, the combined thickness of the silicon dioxide layer, the devices, and the encapsulating layer is preferred to be less than 10 microns.

The individual device elements 103 within the integrated circuit have a cross-sectional dimension 10 along a given axis. These elements 103 can have identical or different geometries and sizes depending on the application. The individual components 103 within the circuit can be separated by the same or differing distances 20,30 along any given axis. The individual crystalline elements 103 can be less than 100 microns in size in any direction. The spaces 20,30 between the circuit components 103 can provide more flexible areas of the circuit. For the purposes of the present application, the cross-sectional area of each device element 103 is the surface area covered by that element on the underlying support surface. Generally, the device elements 103 will have surface areas ranging from a few square microns to several thousand square microns (e.g. between 1 $\mu m^2$ and 10000 $\mu m^2$). The larger the thickness of any given component, the less flexible the resulting circuit.

Figure 1C:
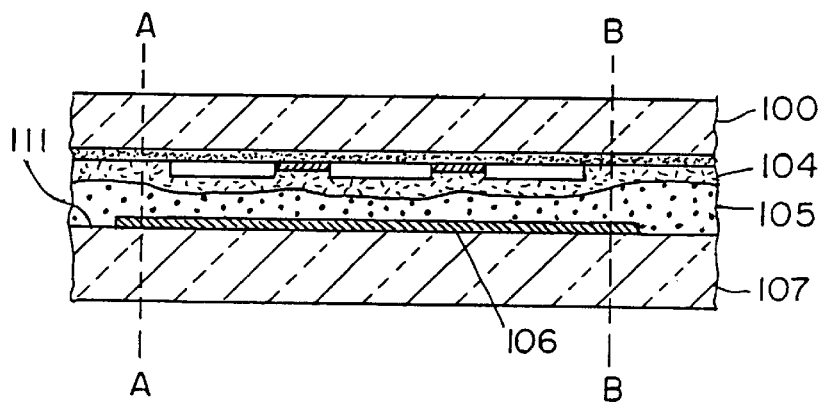

FIG. 1C illustrates a secondary substrate 107, such as glass, a separation layer 106, and a layer of adhesive 105. The separation layer can be a metallic film or foil such as copper. In a preferred embodiment, the separation layer 106 can alternatively serve as an etch stop to allow subsequent etching of the glass substrate 107 while protecting the adhesive layer 105. Preferably, the adhesive layer 105 is less than 15 microns thick, and the separation layer 105, is less than 3000 Angstroms thick. The adhesive layer 105 can be as thick as 3 mils depending upon the particular applications, however. As shown in FIG. 1C, the substrate 100, supporting the active circuit elements 103, is secured to the secondary substrate 107 with the adhesive layer 105 and the intervening separation layer 106. In this single transfer process, the thin-film silicon circuits can be directly transferred onto an application substrate 107, which can be plastic or some other deformable material without the separation layer 106.

In a preferred embodiment, around the periphery of separation layer 106, an edge 111 of substrate 107 directly adheres with adhesive layer 105. In this embodiment, the substrate 107 is released from the separation layer when the entire structure is diced. The width of the peripheral connecting area can vary depending upon the size of the wafer and the area of the wafer being utilized. In general the connecting area can have a width between 1.0 and 10 mm, however, a width in the range of 5–8 mm is preferred for a six inch wafer. For larger wafers or certain device configurations the connecting area can include a circle in the center of the wafer or other symmetric pattern, or can be patterned around and between individual devices on each wafer.

Figure 1D:
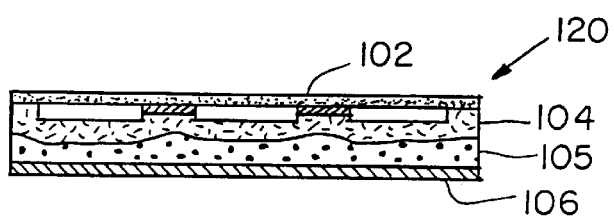

In FIG. 1D, it can be seen that the devices 103, which are transferred onto the secondary substrate 107, are bonded to the separation layer 106 with the adhesive layer 105. The primary substrate 100 is removed by a lift-off or etch procedure described in the above referenced patents to expose the silicon dioxide layer 102. In a preferred embodiment, the secondary substrate 107 is removed at the separation layer 106 simply by peeling off layer 106 from substrate 107.

The various substrate removal procedures can include the chemical and/or mechanical lift-off processes. In this particular example, the structure in FIG. 1C has been diced along lines A—A and B—B. Without the adhesive 105 to secure the circuit to substrate 107 along area 111, the separation layer 106 easily releases from substrate 107 to form the flexible integrated circuit 120 of FIG. 1D.

Figure 2:
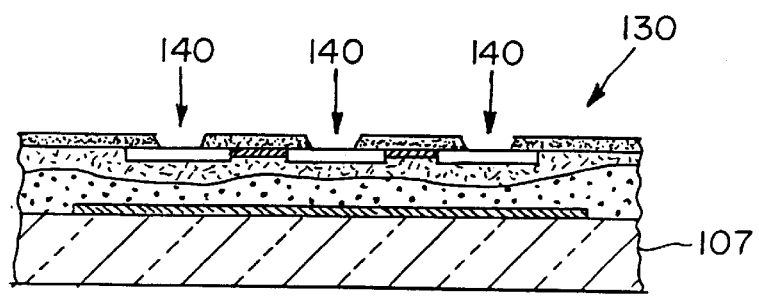
FIG. 2 illustrates the resulting structure of the flexible circuit fabricated in accordance with to the single transfer process of the present invention.

In FIG. 2, illustrates an optional intervening step prior to dicing and removal of substrate 107 in which portions 140 of the silicon oxide layer 102 have been etched to expose a second side 130 of the active circuit devices 103 for additional processing and/or for external connections. The processing on the second side can include formation of light shields for transmissive or reflective active matrix displays or interconnects for a variety of circuit applications. The reflective or transmission display can use ambient light. The second side is subsequently sealed and the device can be mounted for a particular application. The dielectric material used to seal the structure can be applied with a suitable strength and thickness to provide stress relief or level of rigidity for the flexible structure as well as provide a heat sink or ground. The active circuit layer can be positioned at the center of the flexing structure to reduce the stress experienced by the circuit layer and associated interconnects over an acceptable folding range up to the limiting minimum radius of curvature of the device. The minimum radius of curvature of the device will depend upon circuit type and complexity.

Figure 3A:
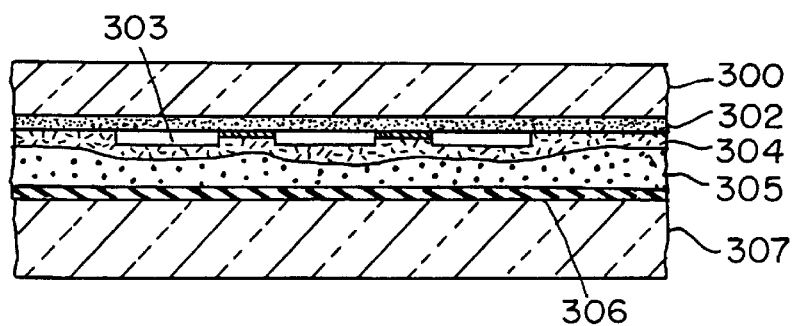
FIGS. 3A to 3C illustrate the preferred double transferred process for fabricating the flexible integrated circuit of the present invention.
Figure 3B:
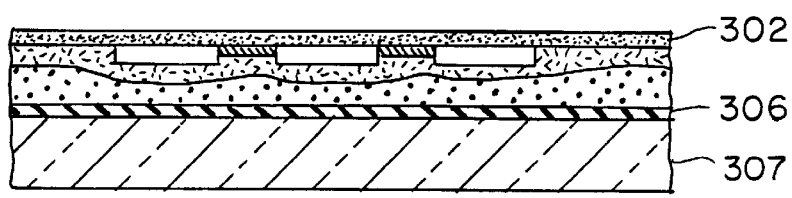
Figure 3C:
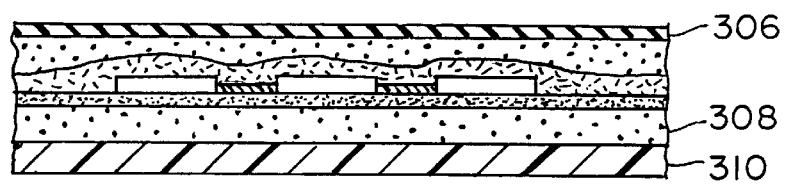

FIGS. 3A to 3C illustrate another embodiment of the present invention for fabricating a thin-film flexible integrated circuit. In particular, these figures describe a double transfer process in which the thin-film circuits are transferred to an intermediate or transfer substrate before being transferred to an application-specific substrate. In FIG. 3A, the integrated circuit devices 303 are formed on a substrate 300 as described by the steps in FIGS. 1A through 1C. As before, this initial structure includes the silicon substrate 300, the silicon dioxide layer 302 formed thereon, the circuit components 303, and the encapsulating layer 304. In FIG. 3A, it is shown that the circuit is transferred onto an intermediate substrate 307. Typically, the intermediate substrate 307 is glass. Again, the circuit is bonded with an adhesive layer 305 to separation layer 306, which in this embodiment is amorphous silicon, that is attached to the intermediate substrate 307.

Figure 4:
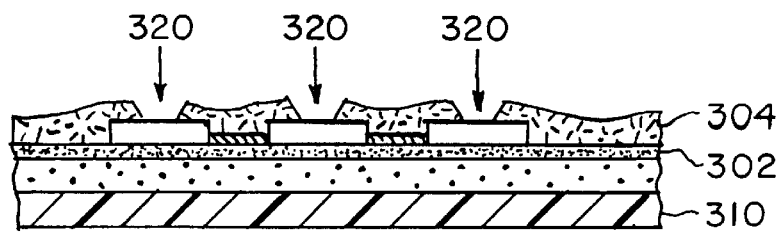
FIG. 4 illustrates the resulting structure of the flexible circuit fabricated in accordance with the double transfer process of the present invention.

In FIG. 3B, substrate 300 is removed by a lift-off procedure as discussed above, and the remaining structure is in condition to undergo any backside processing and a second transfer, possibly to an application-specific substrate. FIG. 3C shows a flexible substrate 310, such as Teflon or plastic, which can be used to carry a flexible circuit in the desired end-product. An adhesive 308 layer is used to bond the final substrate 310 to the laminated structure. The combined structure is then etched to release any temporary or unwanted substrate layers. In this embodiment, the intermediate substrate 307 can be removed by an etching process. An HF solution etches materials such as glass, not affecting other materials, such as copper, amorphous silicon, or Teflon. FIG. 4 shows that the adhesive 305 and separation layer 306 can also optionally be removed to expose areas 320 of the circuit components 303 for further processing including external connections.

Figure 5A:
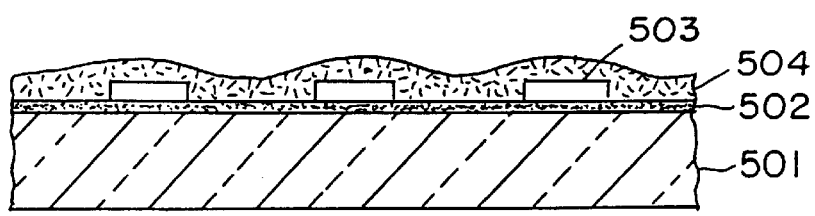
FIGS. 5A–5E illustrate a preferred single transfer process for fabricating flexible integrated circuits on a plastic substrate in accordance with the methods of the present invention.
Figure 5B:
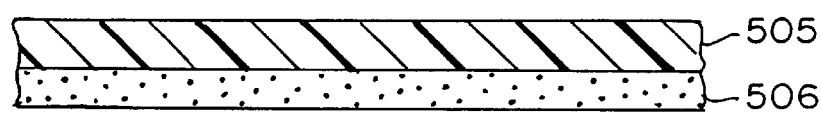
Figure 5C:
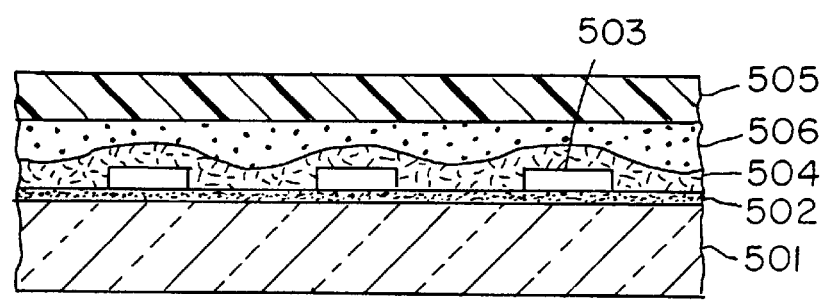
Figure 5D:
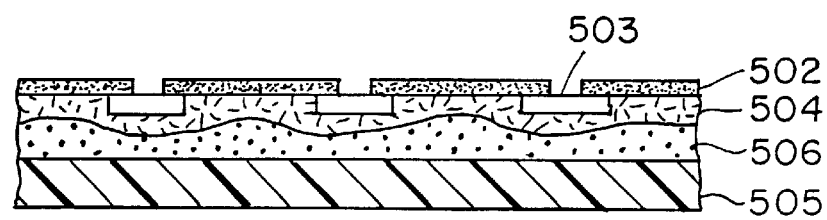

FIGS. 5A to 5D describe another preferred embodiment in which a single transfer process is used to form a flexible circuit on plastic. As with the other embodiments, this process begins by forming a thin layer of single crystal silicon over a layer of silicon dioxide 502 on a silicon substrate 501, as shown in FIG. 5A. Integrated circuits 503 comprising active and passive elements are fabricated with the silicon layer and an encapsulating layer 504 is applied over the circuit elements 503 to protect the same. FIG. 5B shows that a thin layer of plastic 505 is prepared with a layer of adhesive 506 to bond to the circuits 503. Note that the circuit panel in FIG. 5A can be diced into discrete components and pick and place method can then be used for transfer onto the flexible substrate 505. The thickness of the plastic layer 505 can range as thin as a plastic film of a few microns or as thick as a credit card with a thickness in the range of 0.1 mm to 2 mm. The plastic substrate 505 shown in FIG. 5B can range in flexibility from a highly flexible state to a semi-rigid state. The circuit 503 on the silicon substrate is transferred onto the plastic substrate 505 such that the encapsulating layer 504 bonds with the adhesive layer 506. In FIG. 5D, the silicon substrate 501 has been released through a lift-off procedure, as described previously, and portions of the silicon dioxide layer 502 have been removed to expose the active circuit elements 503.

Figure 5E:

Alternatively, the integrated circuits formed on the silicon dioxide layer 502 can be transferred directly onto a plastic layer 505 without using any adhesive. This embodiment is shown in FIG. 5E where the plastic substrate 505 is attached to the encapsulating layer 504. The adherence of the plastic layer 505 is accomplished by applying heat to the structure at about 150° Celsius to partially melt the plastic so that it will bond to the surface of encapsulating layer.

Figure 6A:
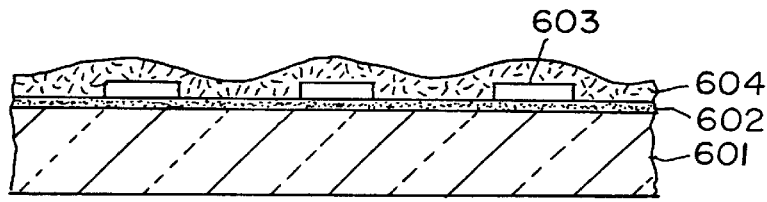
FIGS. 6A–6E illustrate the preferred double transfer process in various form for fabricating flexible integrated circuits on a plastic substrate in accordance with the methods of the present invention.
Figure 6B:
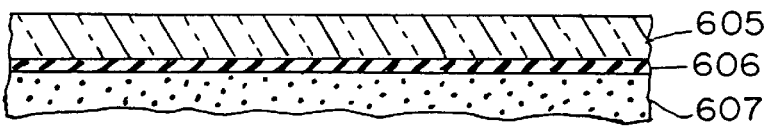
Figure 6C:
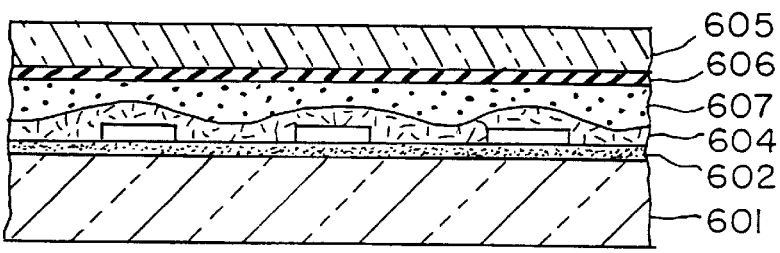
Figure 6D:
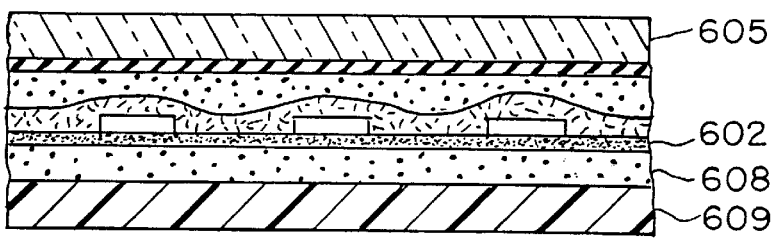
Figure 6E:
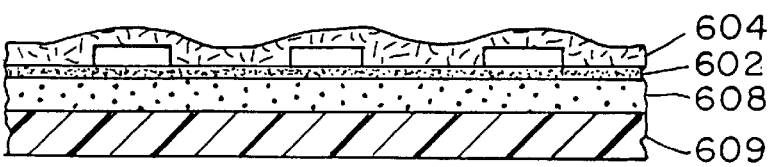

FIGS. 6A through 6E describe another preferred embodiment in which integrated circuits 603 are fabricated and transferred onto a plastic substrate in accordance with the double transfer method as described above. In FIG. 6A, as in other embodiments, this process begins with a silicon substrate 601 and a thin layer of silicon extending over a $SiO_2$ layer 602 formed thereon followed by device 603 fabrication and encapsulation 604. FIG. 6B illustrates a transfer substrate 605 and that a separation layer 606 is covered by the adhesive layer 607. FIG. 6D shows the elements of FIGS. 6A and 6B bonded together. FIG. 6D shows a thin layer of plastic substrate 609 which is bonded with the adhesive layer 608 to the $SiO_2$ layer 602 after removal of substrate 601. FIG. 6E illustrates the flexible circuit in an application ready form, where the intermediate substrate 605 has been etched, and where the separation layer 606, such as amorphous silicon, and the epoxy layer 607, have been released as needed.

Figure 7:
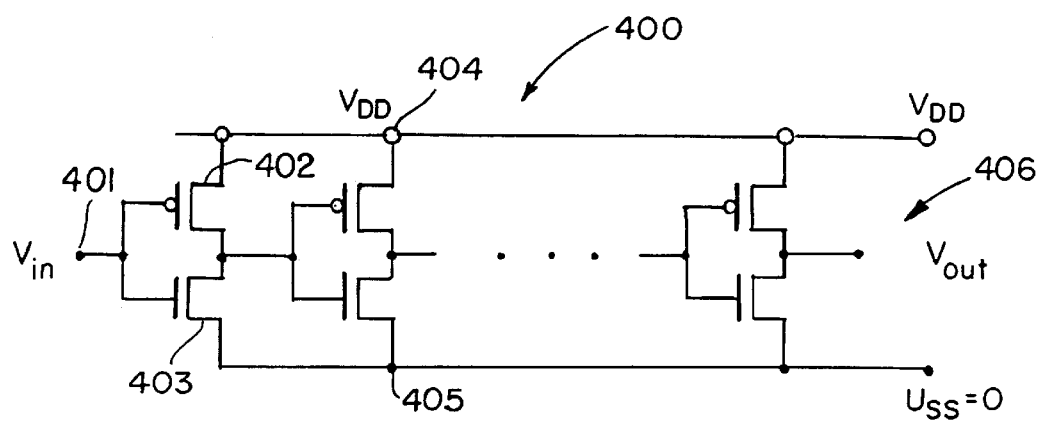
FIG. 7 illustrates a chain of inverters fabricated in accordance with the method of the present invention.
Figure 8:
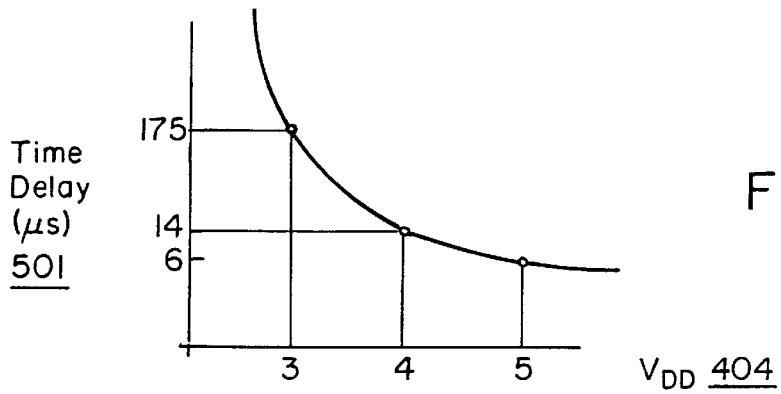
FIG. 8 is a graphical illustration of the time delay associated with the inverter chain as described in FIG. 5.

Performance of a flexible circuit formed by the process of the present invention can be quantified by examining the time delay characteristics of an inverter chain 400 as shown in FIG. 7. FIG. 7 illustrates a chain of 1000 inverters subject to an input voltage ($V_{in}$) 401 of either a high or low signal. The circuit in FIG. 7 was fabricated with an SOI wafer as described herein and transferred onto a copper foil. The foil and the circuit mounted thereon rolled up such that the structure had a radius of curvature of less than 1 cm and was then laid flat and tested. A testing apparatus is arranged to measure the output voltage ($V_{out}$) 406 and to determine the time delay associated with achieving the output response. In FIG. 8, it can be seen that the time delay 501 decreases with respect to the supply voltage ($V_{DD}$) 404 so that the circuit behaves normally even after being rolled up.

Figure 9:
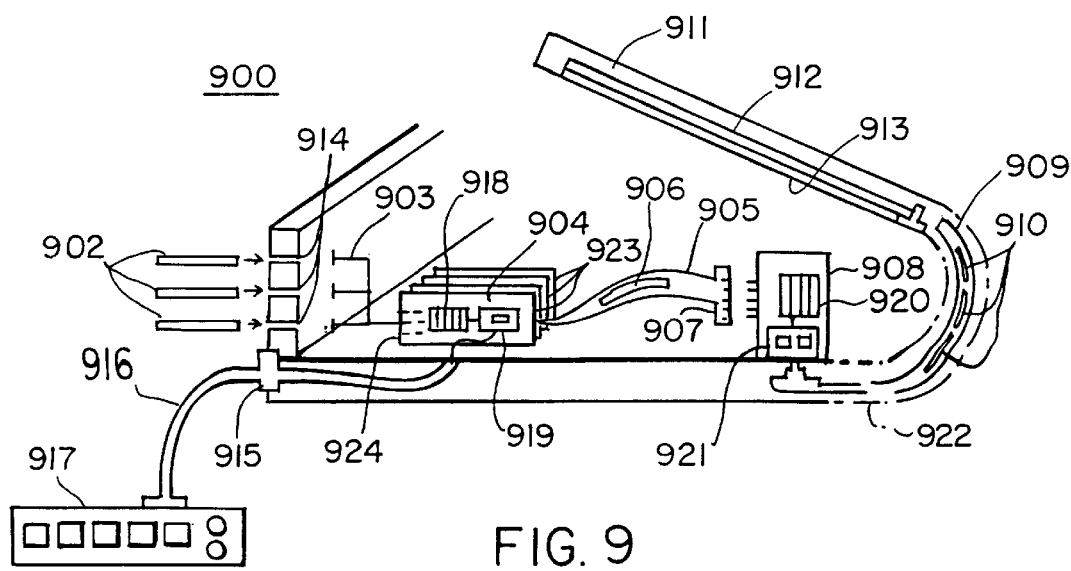
FIG. 9 illustrates an exposed view of a device implementing various forms of flexible circuits fabricated in accordance with the methods of the present invention.

FIG. 9 illustrates, in general, implementation considerations for flexible circuits in various forms. FIG. 9 illustrates a device comprising a housing 901 such as a laptop handheld computer. The system includes packaged internal components that are highly compatible to support a wide range of external and I/O devices.

Typically, the device 900 is controlled by a central processing unit 919 formed within a flexible circuit board 904 fabricated in accordance with the methods of the present invention. The board 904 generally comprises a microprocessor 919 and memory 918. The device 900 can accommodate a plurality of supplemental circuit boards 923 to perform multiple processing as needed. The board 904, as well as the supplemental boards 923, accommodates both direct interface 924 and flexible interface, such as by a cable 905. Unlike cables in the prior art, the cable 905 includes a flexible circuit 906 made in accordance with the methods of the present invention containing active elements to assist in data flow control or other interface operations. The device 900 generally further includes a sub-chassis 908, which comprises a battery 920 and an additional circuit board 921 to perform power control functions and to provide interface to further features of the device.

The device 900 further includes a flexible member 922 which supports a secondary housing 911. It can be seen that the secondary housing 911 can fold over to lay on top of the main housing 901 or stand perpendicular. The secondary housing 911 includes a flat panel display unit 913 and the associated driver circuit 912 having active elements which is laminated directly onto the back surface of the display 913. The display 913 communicates through another cable 909, and as before, the cable 909 can support multiple flexible circuits 910 fabricated directly within the cable 909. Displays as shown in FIG. 9 can be either backlit active or passive liquid crystal displays or emissive displays as described in U.S. Pat. Nos. 5,377,031 and 5,206,749 which are incorporated herein by reference.

The device can be controlled by an internal or external I/O device such as a keyboard or keypad 917. Device 900 further supports a wide range of external devices, such as flexible cards 902 connected by wiring 903 to boards 904, 923, each containing active element circuitry. Implementation of flexible circuits in various forms as made in accordance with the present methods affords extremely high density packaging and portability for devices such as shown in FIG. 9.

Figure 10:
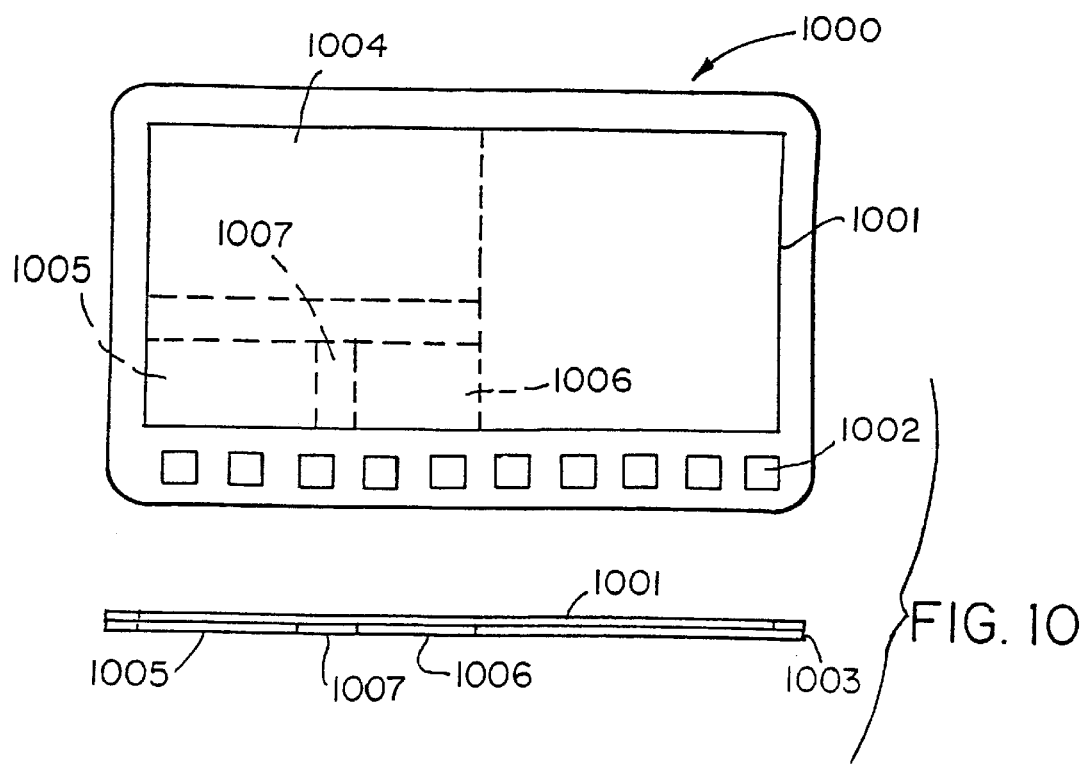
FIG. 10 illustrates a smart card having flexible communication circuits thereon, which are fabricated in accordance with the present invention.

In a further embodiment, FIG. 10 illustrates a smart card 1000 having active communication elements. These cards, having credit card dimensions (i.e. about 3⅜ inches by 2⅛ inches) and material, and can include an ultra-thin display panel 1001. In FIG. 10, beneath the display panel 1001, it can be seen that the card 1000 is controlled by a microprocessor 1005 and memory 1006, and powered by a battery 1007. The display 1001 is driven by a flat circuit driver board 1004 having active display elements. These cards may be carried in pockets or wallets and operate, without degradation in performance, after being bent or dropped. Similarly, wrist watches, pagers and telephones can be equipped with flexible circuits and a display window to provide tele-video communication capabilities. The card can also have a magnetic strip or a magnetic coil. The circuit can be mounted on one side of the coil as an interface.

Flexible circuits and interconnects are important to computer applications, particularly in notebook and subnotebook packaging, where spatial and weight constraints require nominal use of available space. The flexible circuits of the present invention provide significantly thinner and lighter portable components for personal computers. For example, integral circuitry, including the microprocessor, can be fabricated directly onto a notebook or subnotebook display panel, allowing the keyboard chassis exclusively for housing peripherals, such as storage and other I/O devices. In another aspect, a standard PCMCIA card that is receivable through a keyboard slot can include multiple memory and modem devices fabricated on a flexible substrate. As discussed, a host of other components, both analog and discrete, including memory and processors, can be fabricated on flexible substrates to further reduce size and overall weight of a personal computer.

Other applications include charge coupled devices, and imaging devices. An optical emitter detector array, for example, can be formed within a card comprising an optical input to receive an optical signal to an electronic circuit and can use the card's dielectric material to function as a waveguide to transmit the signal from one side of the card to the other.

Figure 11:
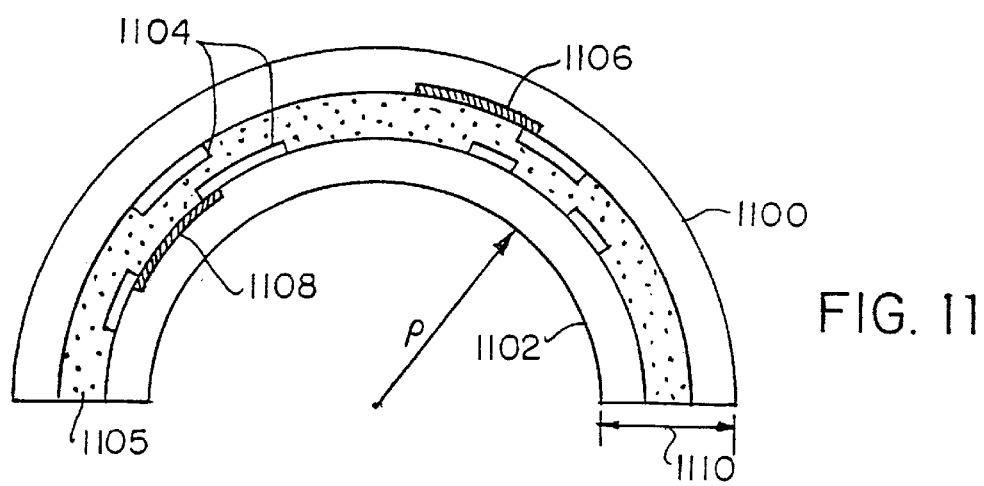
FIG. 11 illustrates flexible circuit fabricated in accordance with the present invention.

Illustrated in FIG. 11 is a flexible circuit made in accordance with the invention and having a thickness 1110 that is folded along an arc having a radius of curvature ρ. In bending such a flat structure, the material on the curved upper surface 1100 is under tension and must stretch to accommodate the curve. The material on the lower curved surface 1102 is being compressed. The thicker the material for a given radius of curvature, the greater the stresses at these two surfaces. The layer containing the active components 1104 is positioned within the structure to minimize the forces of tension and compression when the structure is folded. Layers containing interconnects 1106, 1108 can have greater flexibility and thus can be positioned to accommodate greater levels of tension and compression without failure.

Figure 12:
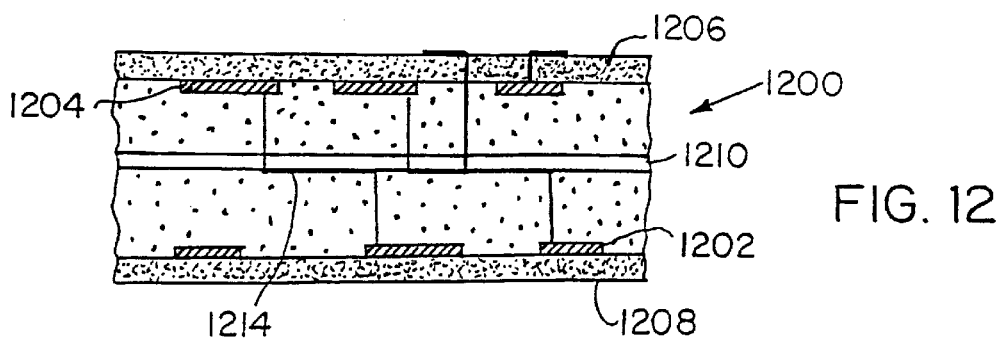
FIG. 12 illustrates a stacked flexible circuit structure having at least three active and/or passive circuit element layers.

Shown in FIG. 12 is a stacked flexible circuit structure 1200 having a first active circuit layer 1202 and a second active circuit layer 1204. These layers have been fabricated n insulating layers 1206 and 1208, respectively. The active layers can be interconnected using interlayer interconnects 1212 and routing interconnects 1214 which can be formed in one or more optional routing layers 1210. Methods for fabricating these multilayer circuits and devices made therefrom have been described in greater detail in U.S. Ser. No. 08/531,177 filed Sep. 19, 1995, U.S. Ser. No. 08/315,027 filed on Sep. 29, 1994 and U.S. Pat. No. 5,376,561, all of which are incorporated herein by reference. In a preferred embodiment, the active circuit layers 1202 and 1204 can be attached on opposite sides of a single layer of adhesive such as elements 1104 on opposite sides of adhesive layer 1105 in FIG. 11. In this embodiment the insulating oxide on which the circuits are mounted face the outside or the circuit structure. It is then possible to remove both of the supporting substrates of each circuit simultaneously or in sequence. This also permits processing through or on the oxide layer on both sides either simultaneously or is sequence. This stacked circuit structure can then be sealed to provide a multilayer active circuit in flexible form.

These stacked structures can be made very thin and can undergo substantial bending when placed in a relatively thick laminated structure. The circuit of FIG. 12 can be sealed within plastic layers (not shown) which can be made relatively thick relative to the circuit. Magnetic strips and optical input and output components can be incorporated into the devices to provide for programming of internal processors and data input and output.

Figure 13:
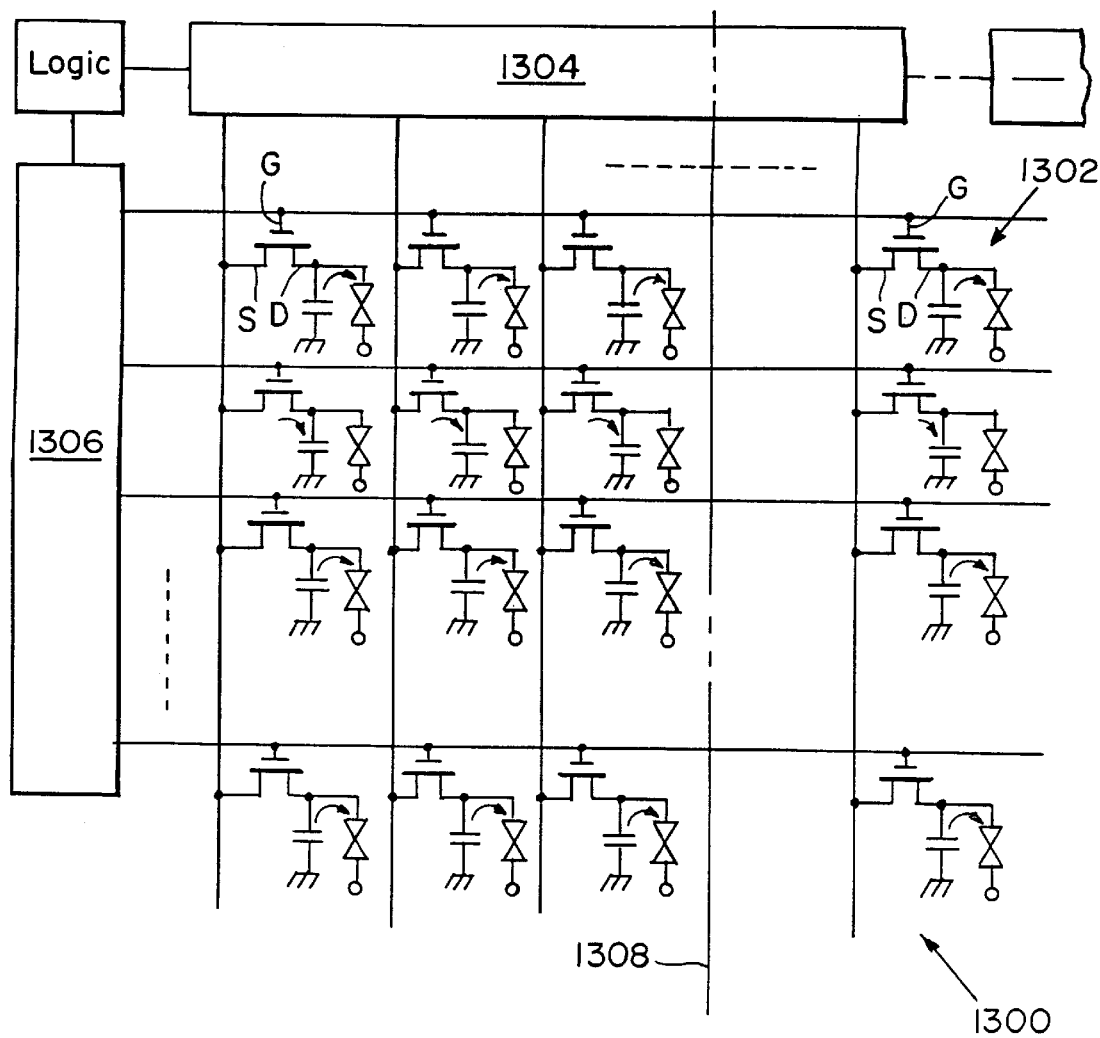
FIG. 13 is a schematic view of a flexible active matrix circuit with integrated column and row driver circuits.

An active matrix circuit 1300 is illustrated in FIG. 13 which has been fabricated with more than 20,000 transistor in the integrated column driver 1304 and row driver 1306 circuits. This structure can be bent around the axis 1308, for example, into a geometry having a radius of curvature of 1 inch without degradation of circuit performance when manufactured as described herein.

Figure 14:
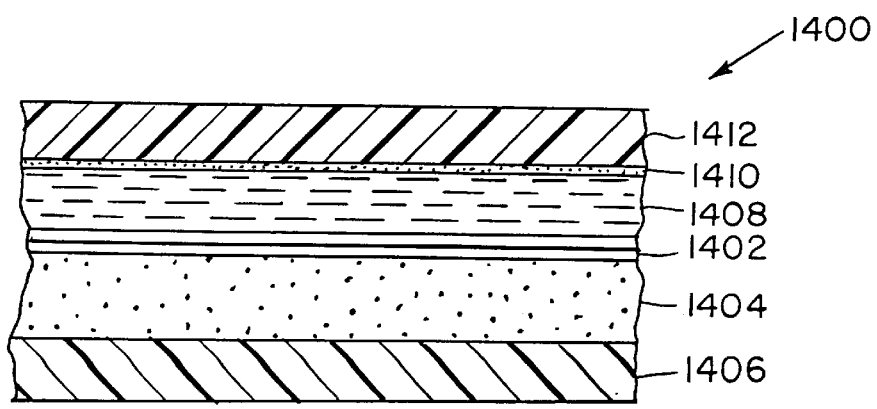
FIG. 14 is a cross-sectional view of a flexible liquid crystal display utilizing the circuit of FIG. 13.

A transmissive light valve such as a liquid crystal display can be manufactured using the active matrix of FIG. 13 that is flexible. Such a display 1400 is illustrated in the cross-sectional view of FIG. 14. In this preferred embodiment, the active matrix circuit 1402 is attached with adhesive layer 1404 to a flexible, optically transmissive plastic film 1406. On the opposite side of the circuit 1402, a flexible solid liquid crystal material 1408, such as a polymer dispersed liquid crystal, is positioned between the circuit and the counter electrode 1410 such as a thin film of indium tin oxide formed on a plastic substrate 1412.

Another preferred embodiment of the invention is illustrated in connection with FIGS. 15A–15E. FIGS. 15A and 15B illustrate a process sequence on a first silicon substrate 1502 to form a transistor circuit 1500 fabricated with a bulk semiconductor wafer or with a silicon-on-insulator structure as illustrated. A circuit can be formed in single crystal silicon material including transistors 1504 which are isolated by oxide layer 1508 and LTO layer 1510. The source or drain region of each transistor 1504 has a metalized contact pad 1506. The contact pads 1506 are located and have a planar geometry suitable for the formation of metal bumps or posts 1512 as shown in FIG. 15B. The post structure 1512 is formed by depositing and patterning a photoresist to expose pads 1506. The openings are filled with a metal and the photoresist is lifted off with a solvent.

A second circuit 1520 is formed over a second wafer 1522, as shown in FIG. 15C. The transistors 1528 are formed in a single crystal silicon film 1526 on an insulating oxide layer 1524 to provide an SOI structure. Thus structure has extended metallized contact pads 1530. After transfer of the circuit 1520 to a flexible substrate 1532 and removal of substrate 1522 by etching 1534 as shown in FIG. 15D, the insulator regions and LTO regions underlying the contact areas 1530 can be removed.

After removal of these areas, the structures in FIGS. 15B and 15D can be aligned and bonded using an adhesive layer 1540 to form a multilayer circuit structure as shown in FIG. 15E. The substrate 1502 can be removed and the device sealed to form a flexible multilevel circuit device.

In another preferred embodiment the upper circuit can include a solid state sensor array 1520 for a camera. The sensor or detector array includes an array of pixel electrodes having high image resolution such as 640×480 up to 1024× 1024 or higher. Further details regarding the structure and fabrication of CMOS image sensors can be found in Fossum, "CMOS Image Sensors: Electronic Camera On A Chip", IEDM pps. 17–20 (1995), the entire contents of which is incorporated herein by reference. These CMOS active pixel sensor devices can operate in the 3–5 V range, have low power operating requirements, and provide full video output. A microlense array can be used over the pixel array to improve optical fill factor. In the present invention, due to the use of stacked underlying circuits to control the sensor, the optical aperture of the detector can be increased due to the reduction in surface area circuitry requirements in the plane of the sensor pixel electrodes.

EQUIVALENTS

Those skilled in the art will know, or be able to ascertain using no more than routine experimentation, many equivalents to the specific embodiments of the invention described herein. These and all other equivalents are intended to be encompassed by the following claims.

We claim:

1. A method of fabricating a flexible circuit device comprising:
   providing a silicon-on-insulator structure including a silicon device layer or an insulating layer that extends over a semiconductor substrate;
   fabricating an integrated circuit with the device layer; and
   transferring the integrated circuit from the semiconductor substrate to a flexible material, the integrated circuit having a plurality of spaced interconnected semiconductor regions that form a flexible integrated circuit.

2. The method of claim 1 further comprising sealing the flexible integrated circuit with a sealant.

3. The method of claim 1 further comprising forming an active matrix liquid crystal display with the flexible integrated circuit.

4. The method of claim 1 wherein the transferring step further comprises adhering the integrated circuit to a second substrate with an adhesive layer, removing a portion of the semiconductor substrate and releasing the second substrate from the integrated circuit.

5. The method of claim 1 wherein the silicon-on-insulator structure comprises a single crystal silicon layer on a silicon dioxide layer that extends over a silicon substrate.

6. The method of claim 1 wherein the flexible material comprises a polymeric material.

7. The method of claim 1 wherein the step of the integrated circuit further comprises device processing on an exposed second side of the integrate circuit.

8. A method of fabricating a thin flexible circuit device comprising:
   providing a first substrate having a semiconductor material on an insulating layer that extends over the first substrate;
   fabricating an integrated circuit with the semiconductor material;
   providing a second substrate having an adhesive layer that is separated from the first substrate with a separation layer;
   transferring the integrated circuit and insulating layer from the first substrate to the second substrate such that the integrated circuit adheres to the adhesive layer;
   removing portions of the adhesive layer to expose the integrated circuit therein; and
   removing the second substrate at the separation layer to provide a flexible integrated circuit.

9. The method of claim 8 further comprising forming a separation layer including copper.

10. The method of claim 8 the forming step includes forming a copper layer that is less than 700 angstroms in thickness.

11. The method of claim 8 further comprising forming the adhesive layer that is less than 15 microns in thickness.

12. The method of claim 8 further comprising forming the flexible integrated circuit with less than 4 microns in thickness.

13. The method of claim 8 further comprising forming the flexible integrated circuit with less than 20 microns in thickness.

14. The method of claim 8 wherein the second substrate is glass.

15. A method of fabricating a thin film flexible circuit device comprising:
   providing a semiconductor substrate;
   fabricating an integrated circuit with the semiconductor substrate;
   providing a second substrate having an adhesive layer separated by a separation layer;
   transferring the integrated circuit from the substrate to the second substrate such that a first surface of the integrated circuit adheres to the adhesive layer;
   forming an intermediate structure that exposes a second surface of the integrated circuit;
   providing a third substrate having a second adhesive layer;
   transferring the intermediary structure to the third substrate such that the semiconductor material adheres to the second adhesive layer; and
   removing the second substrate to expose the first side of the integrated circuit; and
   sealing the integrated circuit to form a flexible integrated circuit structure.

16. The method of claim 15 wherein the separation layer is amorphous silicon.

17. The method of claim 15 wherein the adhesive layer is less than 15 microns in thickness.

18. The method of claim 15 wherein the second adhesive layer is less 15 microns in thickness.

19. The method of claim 15 further comprising removing the separation and adhesive layers to expose the integrated circuit devices to provide a flexible integrated circuit.

20. The method of claim 19 wherein the flexible integrated circuit is less than 20 microns of thickness.

21. The method of claim 15 wherein the flexible integrated circuit is less than 4 microns of thickness.

22. The method of claim 15 wherein the second substrate is glass.

23. The method of claim 15 wherein the third substrate is Teflon.

24. The method claim 15 wherein the separation layer is copper.

25. The method of claim 24 wherein the copper is less than 700 angstroms in thickness.

26. A smart card flexible circuit device comprising:
   a silicon semiconductor material on a silicon dioxide layer;
   an integrated circuit fabricated with the silicon semiconductor material;
   an encapsulating layer to seal the integrated circuit; and
   a flexible support layer adhered to the integrated circuit.

27. The circuit of claim 26 wherein the support layer is copper.

28. The circuit of claim 26 wherein the support layer is Teflon®.

29. The circuit of claim 26 wherein the support layer is plastic.

30. The circuit of claim 26 wherein the integrated circuit comprises a plurality of spaced semiconductor regions on the flexible support layer that are electrically connected.

31. The circuit of claim 26 further comprising an adhesive layer between the support layer and the integrated circuit wherein the adhesive layer is less than 15 microns in thickness.

32. The circuit of claim 26 wherein the integrated circuit is less than 20 microns thick.

33. The circuit of claim 26 wherein the integrated circuit is less than 4 microns thick.

34. The circuit claim 26 further comprising a copper separation layer.

35. The circuit of claim 34 wherein the copper is less than 700 angstroms thick.

36. A flexible circuit comprising:
   a flexible layer of semiconductor material having a first integrated circuit formed with the first layer of semiconductor material;
   a second layer of semiconductor material having a second integrated circuit formed with the second layer of semiconductor material;
   a separation layer between the first integrated circuit and the second integrated circuit, the first integrated circuit being electrically connected to the second integrated circuit,
   an encapsulating layer to seal the flexible circuit; and
   a flexible support layer adhered to the flexible circuit.

37. The circuit of claim 36 wherein the support layer is copper.

38. The circuit of claim 36 wherein the support layer is Teflon.

39. The circuit of claim 36 wherein the support layer is plastic.

40. The circuit of claim 36 wherein each integrated circuit comprises a plurality of spaced semiconductor regions on the flexible support layer that are electrically connected.

* * * * *